United States Patent
Wood

(10) Patent No.: US 7,349,241 B2
(45) Date of Patent: Mar. 25, 2008

(54) SRAM CIRCUITRY

(75) Inventor: John Wood, Santa Cruz, CA (US)

(73) Assignee: MultiGIG, Inc., Scotts Valley, CA (US)

( * ) Notice: Subject to any disclaimer, the term of this patent is extended or adjusted under 35 U.S.C. 154(b) by 0 days.

(21) Appl. No.: 11/621,108

(22) Filed: Jan. 8, 2007

(65) Prior Publication Data

US 2007/0109893 A1    May 17, 2007

Related U.S. Application Data

(62) Division of application No. 11/123,880, filed on May 4, 2005, now Pat. No. 7,193,887.

(51) Int. Cl.
*G11C 11/00* (2006.01)
*G11C 7/00* (2006.01)

(52) U.S. Cl. .............. 365/154; 365/208; 365/189.11

(58) Field of Classification Search ................ None
See application file for complete search history.

(56) References Cited

U.S. PATENT DOCUMENTS

| | | | |
|---|---|---|---|
| 4,125,877 A | 11/1978 | Reinert | |
| 4,792,923 A | 12/1988 | Nakase et al. | |
| 5,534,800 A * | 7/1996 | Hiraki et al. | 327/57 |
| 6,535,417 B2 | 3/2003 | Tsuda et al. | |

OTHER PUBLICATIONS

Qin et al., Mar. 2004 "SRAM Leakage Suppression by Minimizing Standby Supply Voltage," Proceedings on the International Symposium on Quality Electronic Design, IEEE.

Degalahal et al., Jan. 2003 "Analyzing Soft Errors in Leakage Optimized SRAM Design," 16th International Conference on VLSI Design.

Flautner et al., 2002 "Drowsy Caches: Simple Techniques for Reducing Leakage Power," University of Michigan 29th Annual International Symposium on Computer Architecture, pp. 1-10.

Hsiao, M.Y., Jul. 1970 "A Class of Optimal Minimum Odd-weight-column SEC-DED Codes," IBM Journal of Research and Development, 14(4):395-401.

(Continued)

*Primary Examiner*—Amir Zarabian
*Assistant Examiner*—Michael Weinberg
(74) *Attorney, Agent, or Firm*—Anthony B. Diepenbrock, III; Dechert LLP

(57) ABSTRACT

A static ram cell is described. The cell includes a pair of cross-coupled transistors and a pair of diode-connected transistors operated from a wordline that provides power to the cell. The cell has three main operating modes, reading, writing, and data retention. Reading is performed by sensing current flowing from a powered-up wordline through a conductive one of the cross-coupled transistors. Writing is performed by pulsing the source of the conductive one of the cross-coupled transistors with a positive voltage to flip the conductive states of the cross-coupled transistors. Data retention is performed by using leakage currents to retain the conductive states of the cross-coupled transistors. A decoder for an array of static ram cells may be operated synchronously and in a pipelined fashion using a rotary traveling wave oscillator that provides the clocks for the pipeline. The cell is capable of detecting an alpha particle strike with suitable circuitry.

5 Claims, 7 Drawing Sheets

NEW SRAM CELL WITH TRANSISTOR AND NODE NAMES SHOWN

OTHER PUBLICATIONS

Rebaudengo et al., Mar. 2003 "An Accurate Analysis of the Effects of Soft Errors in the Instruction and Data Caches of a Pipelined Microprocessor," Proceedings of the Design, Automation and Test in Europe Conference and Exhibition (IEEE).

Agarwal et al., Mar. 2003 "Expoloring High Bandwidth Pipelined Cache Architecture for Scaled Technology," Proceedings of the Design, Automation and Test in Europe Conference and Exhibition (IEEE).

* cited by examiner

TYPICAL SRAM ARRAY CONFIGURATION

NEW SRAM CELL WITH TRANSISTOR AND NODE NAMES SHOWN

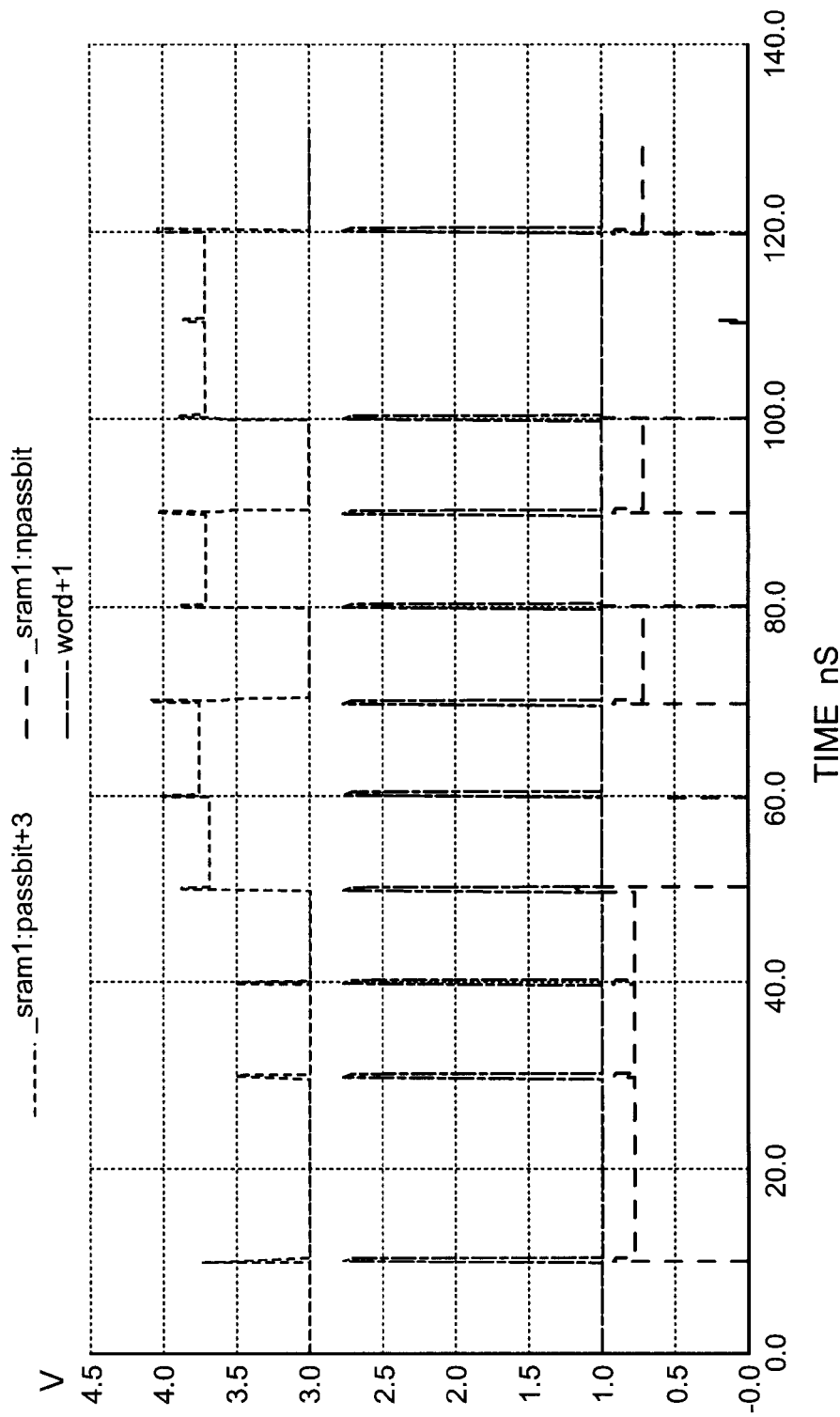

SRAM CIRCUITRY

CROSS-REFERENCE TO RELATED APPLICATIONS

This application is a divisional of U.S. patent application Ser. No. 11/123,880, now U.S. Pat. No. 7,193,887, filed May 4, 2005 which claims priority to and incorporates by reference into the instant application Great Britain Application titled "SRAM04," having patent application number GB0409728.3, filed May 4, 2004.

FIELD OF THE INVENTION

This invention relates generally to SRAM cells and more particularly to a high speed, low power SRAM cell.

DESCRIPTION OF THE RELATED ART

Leakage current in sub-100 nanometer (nm) VLSI devices is becoming an increasing problem with each generation. At such a small scale, the transistors have problems 'turning off' (because the threshold voltage Vth is reduced, which increases sub-threshold current) and most CMOS circuits including SRAM and static logic will leak current from VDD to GND through P- and N-channel transistors. These currents are in the order of 25 nA per transistor pair. With possibly 1 billion transistors on a chip, the amount of power wasted can be large. Sub-threshold leakage increases dramatically with temperature and supply voltage. Note that the other, often quoted, leakage mechanism, gate leakage, can be solved with the correct 'CMOS recipe' (see Intel process press-releases due for introduction 2007, which uses high-K dielectric and metal gate).

Many VLSI chips today are largely comprised of SRAM arrays (60% of chip area) with the remainder being logic circuits. An SRAM is prone to leak energy because of its CMOS (Pmos, Nmos) configuration with obvious leakage paths.

Reducing VDD to reduce leakage current in SRAM and its optimization/tradeoffs have been an active research topic. Please refer to references [1] and [2].

[1] SRAM LEAKAGE SUPPRESSION BY MINIMIZING STANDBY SUPPLY VOLTAGE. PROCEEDINGS ON THE INTERNATIONAL SYMPOSIUM ON QUALITY ELECTRONIC DESIGN, Huifang Qin, Yu (Kevin) Cao, Dejan Markovic, Andrei Vladimirescu, Jan Rabaey, IEEE, March, 2004. Web: http://www.gigascale.org/pubs/519.html.

[2] ANALYZING SOFT ERRORS IN LEAKAGE OPTIMIZED SRAM DESIGN, V. Degalahal, N. Vijaykrishnan, M. J. Irwin, 16th International Conference on VLSI Design, January 2003. Web: http://www.gigascale.org/pubs/366.html Modulating VDD of the SRAM to reduce power is a known technique. See so-called "Dozy Cache" schemes. See reference [3].

[3] DROWSY CACHES: SIMPLE TECHNIQUES FOR REDUCING LEAKAGE POWER, Krisztián Flautner, ARM Ltd Nam Sung Kim, Steve Martin, David Blaauw, Trevor Mudge, University of Michigan 29th Annual International Symposium on Computer Architecture 2002, web: http://csdl.computer.org/comp/proceedings/isca/2002/1605/00/16050148abs.htm

BRIEF SUMMARY OF THE INVENTION

An embodiment of the present invention is a static ram cell that includes a pair of cross-coupled transistors and a pair of diode-connected transistors. Each of the pair of cross-coupled transistors has a gate node and a channel between a source node and drain node, where the first transistor of the pair has the drain node connected to the gate node of the second transistor of the pair, and the second transistor of the pair has the drain node connected to the gate node of the first transistor of the pair, the source node of the first transistor of the pair being the true bit line and the source node of the second transistor of the pair being the complement bit line. Each of the pair of diode-connected transistors has a gate node and a channel between a source node and drain node, wherein the channel of the first of the pair of diode-connected transistors is connected between the drain of the first of the cross-coupled transistors and a word line, and wherein the channel of the second of the pair of diode-connected transistors is connected between the drain of the second of the cross-coupled transistors and the word line. The state of the cell is based on which of the cross-coupled transistors is conductive.

A method in one embodiment of the present invention of reading the cell includes (i) setting a wordline of the cell to a first reference voltage, where the wordline provides the current for reading the state of the cell, the cell having true and complement bit lines, (ii) setting a mode line of true and complement sense amplifiers connected to the true and complement bit lines, respectively, of the static ram cell to a second reference voltage, and (iii) detecting the current flowing in the true or complement bit lines of the cell to sense the state of the cell.

A method in one embodiment of the present invention of writing the cell includes (i) setting a wordline of the static ram cell to a first reference voltage, where the wordline provides the current for writing data into the cell, the cell having true and complement bit lines, with the bit line having a conductive path to the wordline and the complement bit line having a non-conductive path to the wordline, (ii) connecting the bit line via a first switch and the complement bit line via a second switch to a second reference voltage, (iii) pulsing the bit line of the cell to the first reference voltage during a short time interval to write new data into the cell, such that the complement bit line has a conductive path to the wordline.

A method of retaining data in the cell in one embodiment of the present invention includes setting a wordline of the static ram cell to a voltage that provides leakage currents to the cell, the cell having true and complement bit lines, with the bit line having a conductive path for carrying the leakage currents from the wordline and the complement bit line having a non-conductive path to the wordline.

The SRAM cells of the present invention have the advantages of (i) being very fast, on the order of 100 pS for a read on a 0.18 μm CMOS; (ii) needing no VDD or VSS wires, as retention power is taken from the bit and wordlines; (iii) having low leakage current through supply modulation; (iv) having small cells, only 4 transistors and 5 active contacts; (v) capable of being implemented as a fast "all NMOS" cell; (vi) having a low leakage current retention mode; and (vii) being coupled with a very fast current-mode sense amplifier.

BRIEF DESCRIPTION OF THE DRAWINGS

These and other features, aspects and advantages of the present invention will become better understood with regard to the following description, appended claims, and accompanying drawings where:

FIG. 4A shows the voltage waveforms in the various modes of operation;

DETAILED DESCRIPTION OF THE INVENTION

Array Blocks

Figure 1:
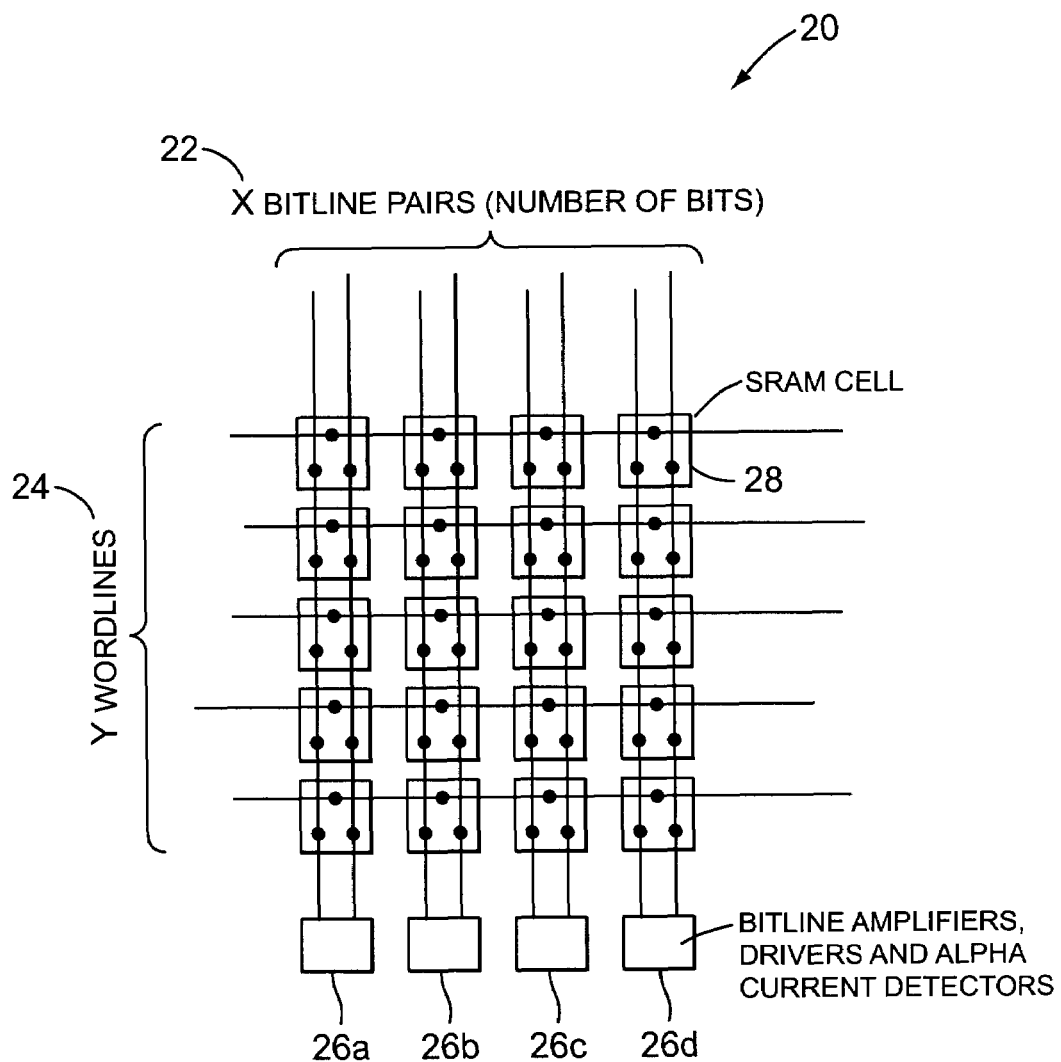
FIG. 1 shows an array of SRAM cells.

Arrays 20 are built up in the X direction 22 to make the memory wider, and in the Y direction 24 by adding more wordlines. The bitlines 22 are commoned. An array 20 of SRAM cell shown in FIG. 1 together with the Wordline drivers and the bitline amplifiers 26a-d completes an X*Y array 20.

Multiple Blocks

Multiple array blocks would ordinarily be deployed. This helps in several ways. It makes redundancy easier to implement on the array level. It makes access time faster on smaller, less capacitive arrays. The circuits in the individual blocks need only be matched to the local CMOS PVT process conditions on that part of the die. It eases matching requirements etc.

New SRAM Cell and Drive Circuits

The circuit here aims to give all the benefits associated with the above approaches but in a much simpler way with less overhead in terms of area and delay. It should be noted that the circuit is drawn using NFET transistors, although PFETs could be used in place of any/all of the transistors with the obvious changes of signal polarities required. Also, depletion mode Nfets could be used as could PN diodes and breakdown diodes as will become obvious from the explanation of how the circuit works.

Figure 2:
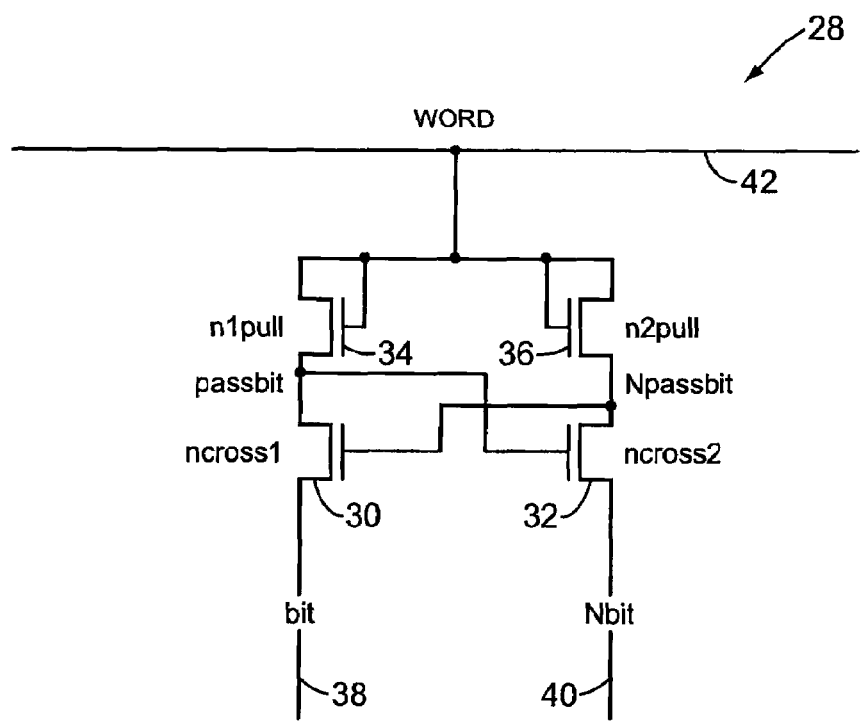
FIG. 2 shows the basic SRAM one-bit memory cell.

FIG. 2 is the basic SRAM 1-bit memory cell 28. It comprises two back-back transistors 30, 32 as the state element plus two other diode-connected NFETs 34, 36 acting as dual-purpose pullup/access transistors. Superficially, this is similar to the cell shown in FIG. 8 "4T SRAM cell, without VDD" of [2], but the cell of the present invention is configured differently and operates in an entirely different way. It has no ground connection at all (suits SOI especially) and the cell has no pass transistors activated by the wordline. The cross-coupled transistors 30, 32 of the present invention actually connect directly to the bitlines 38, 40. Finally, the wordline drivers are different and the bitline detection mode and circuits are different. In the default quiescent operation, lines bit 38 and nbit 40 are held to ground, and the word line 42 is held to a zero or positive voltage (which can vary from about 0 volt to full VDD as will be explained later).

Sense Amplifiers/Bias

Figure 3:
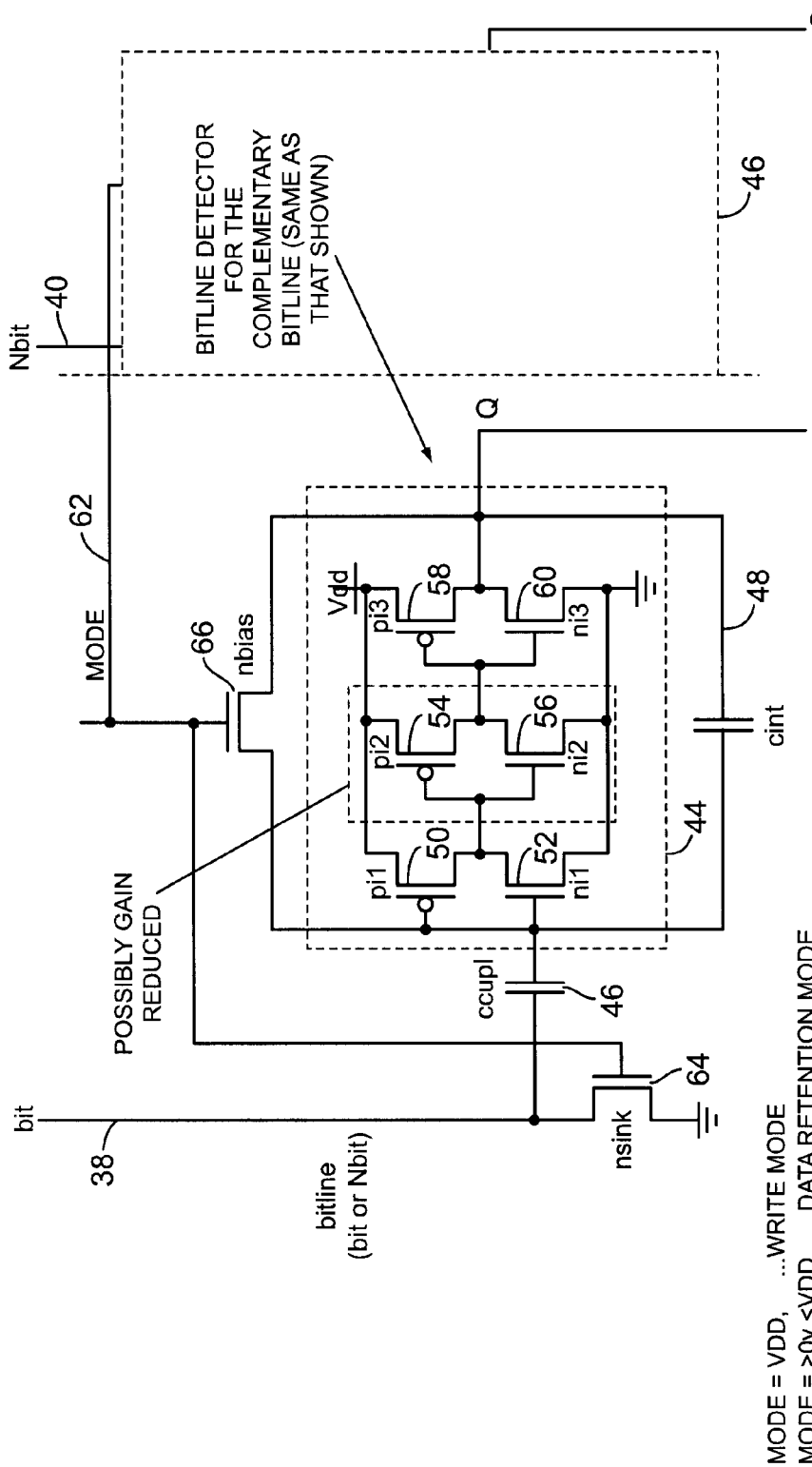
FIG. 3 shows the current-mode sense amplifiers connected to each of the bitlines.

FIG. 3 shows the current-mode sense amplifiers 44 which terminate each of the bitlines. They serve three purposes. First, they amplify and integrate the current-pulse signals received during reading of the array to make logic-level voltages from the small-signal bitline currents. Second, they provide a current-return path for the leakage/standby current of the array in the Data-retention mode. Third, they help detect alpha-particle or cosmic ray strikes.

Circuit Description

Basically, the sense amplifier circuit operates as a charge integrator. During amplification, (read mode) the bitline is kept at a low impedance by the coupling capacitor ccupl 46 and the feedback capacitor cint 48 around the amplifier formed from inverters (ni1 50, pi1 52), (ni2 54, pi2 56), and (ni3 58, pi3 60). Therefore, the voltage on the bitline (nominally) doesn't change during detection and instead any integrated current from the bitline swings the Q output towards ground.

In the data-retention mode, the MODE signal 62 can be lowered which keeps the Fets nsink 64 and nbias 66 slightly on, providing enough sink current to power the SRAM cells but allowing for a detection of an alpha-strike (described later) on either the Q and nQ outputs.

The following comments should be kept in mind.

In the diagram, the two sense amplifiers are both single-ended, but could be cross-coupled to be a true differential amplifier.

Stage 2 (or other stage) of the inverting amplifier may need gain-reduction (resistive load) to prevent the amplifier from oscillating due to phase-lag in the amplifier.

VDD of the sense amplifiers are dropped for the data-retention mode (circuitry Not shown).

CMOS circuits are shown, but NMOS only amplifiers are well-known and can yield an entirely NMOS SRAM chip at lower cost than CMOS due to reduced number of mask layers required.

Signal integrity is expected to be good because the current-mode detection method involves almost no voltage signal switching on the bitlines.

Operating Modes of the Array

There are four definite modes of operation of the SRAM, selectable on a word-basis: (1) data retention (low leakage); (2) read; (3) write 1; and (4) write 0.

Data Retention Mode

When the word line 42 is raised more than one threshold voltage above bit 38 and nbit 40 voltage (usually 0 v). Transistors n1pull 34 and n2pull 36 provide a weak pull-up current to the drains of ncross1 30 and ncross2 32 and like an ordinary SRAM cell, whichever is the current state of the bit is reinforced by the feedback paths of the cross-coupled devices 30, 32. The wordline drivers are able to provide this low voltage (between 0.2 volts . . . 0.8 volts) to retain the state of the memory at low leakage current between write cycles (and read cycles, which fully recharge the state). In fact, it is the just the imbalance of sub-threshold (leakage) currents in the cross-coupled transistors (caused by the gate voltage imbalance when the cell was written or read) which retains the state, and all transistors are able to operate in the sub-threshold range. Voltage on the word drive line 42 effectively sets the pull-up or even leakage current for the block.

Read Mode

In the read mode, the word line 42 is raised to approximately VDD, and transistors n1pull 34 and n2pull 36 provide a strong pull-up current to the drains of ncross1 30 and ncross2 32. During read-mode, the state of the bit is determined by monitoring the current flowing into lines bit 38 and nbit 40. For a logic 1 stored in the SRAM cell (ncross1 30 is turned on) current flows from word 42 out to bit 38. The other bitline nbit 40 receives current only if logic 0 had been stored in the cell, so the two bit line currents are mutually exclusive. When operating in an SRAM array, non-selected wordlines are held at the data-retention voltage level. No current therefore flows into the unselected wordlines. Additionally, the transistor common bitline loading from the inactive wordlines does not significantly affect the detected current-signal (current mode detection is at low voltage swing).

Write Mode

In the write mode the bitlines are used to set the state of the memory element instead of reading the state. Write mode begins is exactly like a read mode event (and this can be exploited to do read-modify-write access) with word line 42 being raised to approximately VDD and with the bit 38 and nbit 40 lines held low. This 'powers up' the bit cell 28 and allows it to be written. Assume for this example that the data currently in the cell is a '1' (i.e., ncross1 30 is on, and ncross2 32 is off), and it is desired to change the data to a zero. To do this, the line bit 38 is raised high very quickly to VDD whereupon, by virtue of ncross1 30 being switched on, it conducts to allow passbit signal to go high. Very quickly this causes ncross2 32 to turn on, which discharges the gate of ncross1 30 (node Npassbit drops low) turning it off. Once flipped, the feedback reinforces the state which persists as bit 38 is brought back to 0 v. Note that the bitline used to write the bit of a particular state is the opposite bitline to that which detects the current corresponding to the state. Also note that there is a charge pumping mechanism whereby the gates of the Nfet rise with the source signals during the write operation and this effect could also be exploited for generating higher voltage gate signals for hot-electron tunneling type devices such as Flash memory cells.

Exemplary Waveforms

Figure 4B:
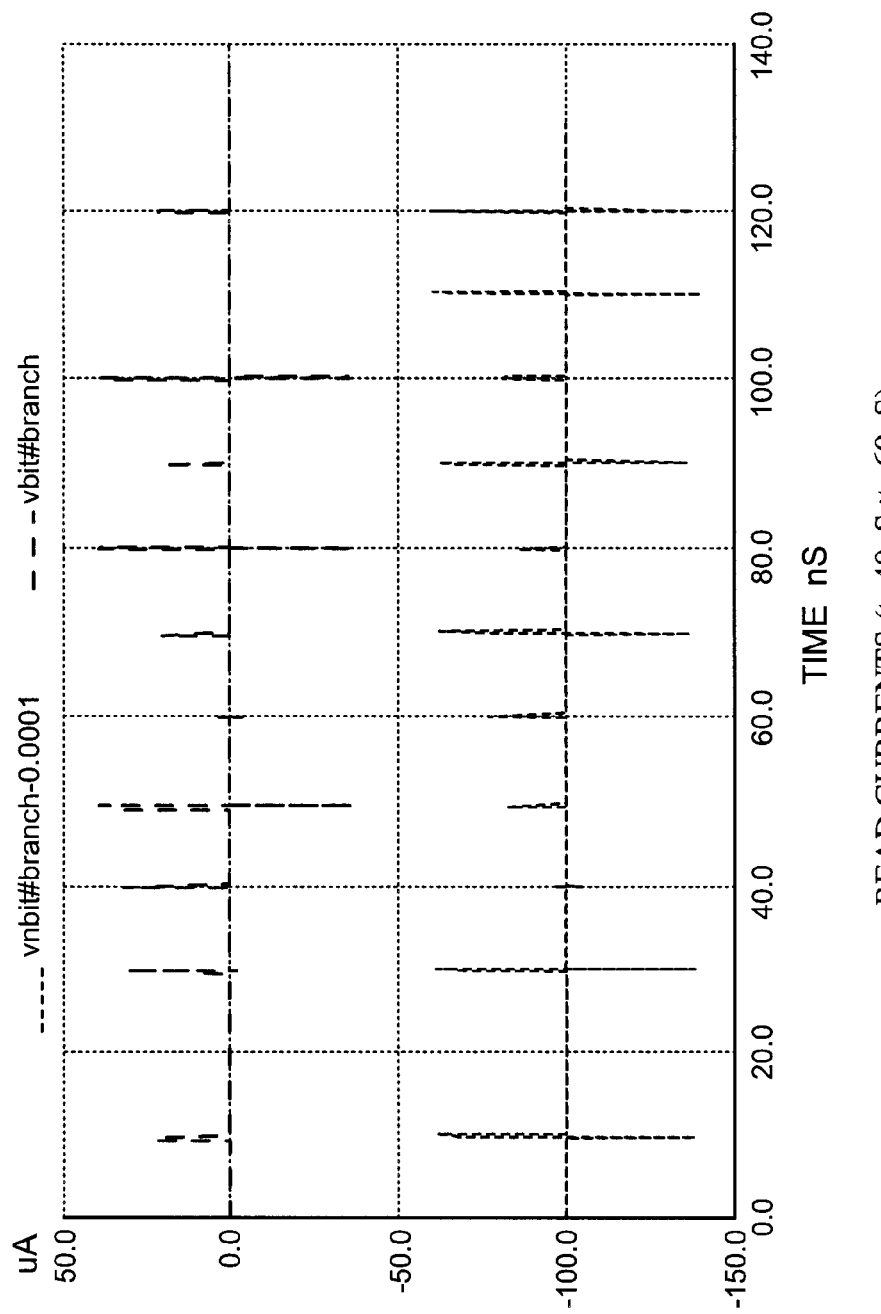
FIG. 4B shows the current waveforms in the various modes of operation.

FIGS. 4A and 4B show the operation of a single-bit cell in a combination of read, write and data-retention modes.
t=10 nS, writing a "1"
t=20 nS, no operation (data-retention mode)
t=30 nS, writing a "1"
t=40 nS, reading
t=50 nS, writing "1"
t=60 nS, writing "0"
t=70 nS, writing "1"
t=80 nS, writing "0"
t=90 nS, checking retention of non-selected wordline when writing "1" to another word.
t=100 nS, writing a "1"

Alpha Particle Corruption

Most SRAM circuits are very sensitive to alpha particle or cosmic ray corruption of stored bit values, especially when operating at low voltage and low stored capacitance as is typical of sub-100 nm VLSI circuits. The circuit of the present invention is no different in this regard and can have the logic state altered by the impact of ionizing radiation. Alpha strikes in the silicon lattice free current carriers (electrons/holes) effectively turning-on transistors which may have been off. For a conventional SRAM cell this can be catastrophic and can flip the bit, i.e., currents induced by the free carriers could flow around the VDD and VSS lines in the cell and could swap the charge polarities on the back-back inverters. The event would go unnoticed outside of the bit cell until bad data is read back on the next access. The usual methods of prevention and/or recovery from these Single Event Upset (SEU) errors are well known in the literature, such as Error Detection and Correction EDAC [4], which rely on things like redundant bits coupled to Hamming-codes to find and repair one or more errors. If needed, EDAC circuits can be built into the synchronous pipeline of the new SRAM system (described later) to avoid decreasing throughput, but there is another possible method of dealing with the problem.

A CLASS OF OPTIMAL MINIMUM ODD-WEIGHT-COLUMN SEC-DED CODES, M. Y. Hsiao, *IBM Journal of Research and Development* [online] (Vol. 14, No. 4) (July 1970), available from: http://www.research.ibm.com/journal/rd/144/ibmrd1404I.pdf.

Scrubbing

Scrubbing refers to a background task by which an EDAC equipped multiport (i.e., two possible address/data access port) SRAM array is able to transparently fix memory errors. A separate scrubbing state machine steps through each memory location and looks at the syndrome [4] bits to find and fix any one-bit error by writing back to the memory. The main processor is largely unaware of the scrubbing process and in all likelihood never sees a bad data bit because of the background 'scrubbing' process.

Error Detection and Correction Ability

Figure 5:
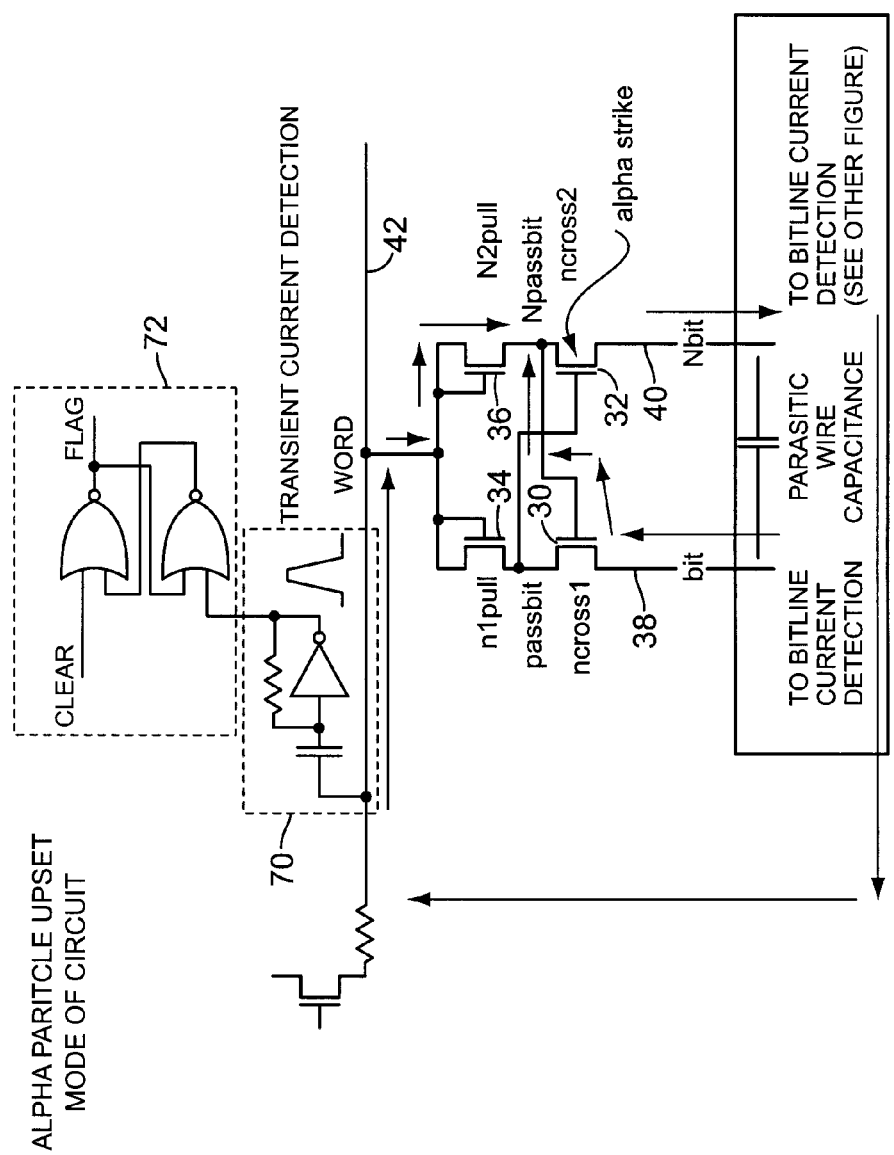
FIG. 5 shows the relevant current paths and detection circuitry used when a strike event occurs.

An interesting aspect of the SRAM cell of the present invention is the lack of VDD or VSS supplies and the provision of current sensing mechanisms in the bitlines and wordline (FIGS. 3 and 5). This offers an intriguing possibility of directly detecting for alpha (or other) particle strikes and repairing these directly without the need for redundancy or ECC. Observing the new SRAM cell in the data retention mode, there should only be a static DC current corresponding to the bias current of the cell and with SOI, because of the lack of a substrate connection, no current can flow in the cell without it involving current flow between two or more of the three terminals shown in the diagram. The system works as follows. For most of the time, most of the SRAM arrays on a chip are in the data-retention mode. In this mode the cells are vulnerable to corruption from an alpha-strike because of low cell voltage and weak pull-up currents. Now, consider an alpha strike on transistor ncross2 32 while the state of the cell is "1" (ncross1 30 is on, ncross2 32 is off). Current is induced to flow in ncross2 32 and the only paths it can flow are those shown in FIG. 5. All current flow paths are detectable externally. Only an additional transient current-sensor 70 in the wordline is needed. The alpha strike is then recorded in its an X and Y position by the latching detectors 72. The Y position is given by the corresponding wordline transient detector bit and the X position by the location of a differential transient current between the bitlines. Effectively, the alpha strike can be thought of as an "unexpected read" of the SRAM data. By detecting the polarities of the bitline current detectors, the state of the bit before it was corrupted can be found. Alpha strikes that cause no change in signal polarity, such as strikes to a NFET which it is already on, are of no interest. Strikes on ncross1 30 when it happens to be off (cell state is 0), are recorded with the opposite polarity on the bitline current detectors. The principle can be extended to strikes on the diode/pullup transistors 34, 36. The FLAG output of the latching circuit 72 can directly invoke a "scrubbing" process to reinstate the correct state on the bit which position and proper state is known.

Cache Application of Soft Error Detection

Cache SRAM memory on modern microprocessors contributes to a lack of reliability [6] and these problems are expected get worse as dimensions and voltage shrink. For the application of an SRAM memory cache, a simpler but still useful version of the system described previously can exploit the detection of soft errors, but use an existing mechanism to do the correction. In this application, whenever the CPU requests an item from the cache and where there is a soft-error (FLAG set from the word or bitline decodes (see above)), we can force the return of a "Miss" on the cache, independently of the normal hit/miss flag logic. This forces the memory subsystem to execute a fetch from external DRAM. As is the nature of cache, this data is automatically propagated to the cache SRAM and so the external fetch itself fixes the fault. The error flags could apply to a single bit, single word or an entire block of memory. For example, it is simpler to implement a scheme on a cache where a single soft-error anywhere in the block flags that the whole block is invalid (not in the cache). This can be done by resetting all the entries of the cache lookup mapping to the block in which there is a soft error. These bits go back to normal one by one when a new external fetch occurs for that address. Both the TAG and the RAM banks of the cache can be protected. An error detected in the TAG cache line also invalidates a possible "HIT" caused by that lookup in the TAG.

[6] AN ACCURATE ANALYSIS OF THE EFFECTS OF SOFT ERRORS IN THE INSTRUCTION AND DATA CACHES OF A PIPELINED MICROPROCESSOR, M. Rebaudengo, M. Sonza Reorda, M. Violante, *Proceedings, Design, Automation and Test in Europe Conference*, 3-7 Mar. 2003, Messe Munich, Germany. Web: http://www.date-conference.com/conference/2003/

Routability on SOC Chips

With the redesign of the SRAM cell and its array according to the present invention, we can look at addressing another problem of SOC design, which is the fact that SRAM macros cause blockages in the routing layers. SRAMs usually only occupy metal one M1 and metal two M2. Concerns over signal integrity of the sense amplifiers often disallows routing over the SRAM on other metal layers, perhaps all the way to M4. It is an aspect of the present invention that we build-in porosity to the SRAM as far as routing is concerned, because of the reduced use of wiring (No VDD, VSS needed), and we can rotate SRAM blocks as needed to reorient with the prevailing routing direction on the layers.

Pipelined Memory Decode

Multithreading

Many microprocessors today are multi-threaded, which is a mechanism for avoiding the penalty of large memory or other off-chip latencies. A multi-threaded machine is a multi-threaded (or multi-tasking) machine and switches threads immediately after issuing an address request for off-chip memory data which might take many clock cycles to return. By switching threads, another thread can be continued whose latency will typically have been absorbed during that thread's idle time. That is, if a memory request has stalled the thread, the data should be available when the thread is continued. Conceptually, by switching among the threads, the microprocessor is kept fully utilized and the multi-threaded application program executes faster than a single-threaded application which is periodically idle while waiting for off-chip data.

In practice, the internal memory controller and the external memory itself can be a bottleneck. For example, if it takes 20 clock cycles to fetch a given data word from external memory, then the maximum number of memory requests is 1 per 20 clock cycles of the microprocessor. The code for each thread can comprise at most 5% external memory references if the latency of the memory interface is not to be exposed (this figure is relaxed when a cache is used, and various levels of internal caches have lower levels of latency).

Pipelined Memory Decoder

A solution to the above problem, without requiring large amounts of cache memory, is to increase the throughput of the memory system for the multi-threaded microprocessor. Despite increased memory latency, the throughput can be improved to one random read/write per clock cycle if the memory decoder is pipelined [5]. Multiple requests to memory locations flow down the pipeline in the memory decoder and perhaps take 20 clock cycles to ultimately activate the correct Row/Column. But, the point to note is that each clock cycle presents a new Row/Column decode and is able to perform a new random access data read or write. Using a smaller amount of the expensive and area-consuming on-chip cache RAM, similar performance can be achieved. The SRAM circuits described previously are applicable to this technique.

Figure 6:
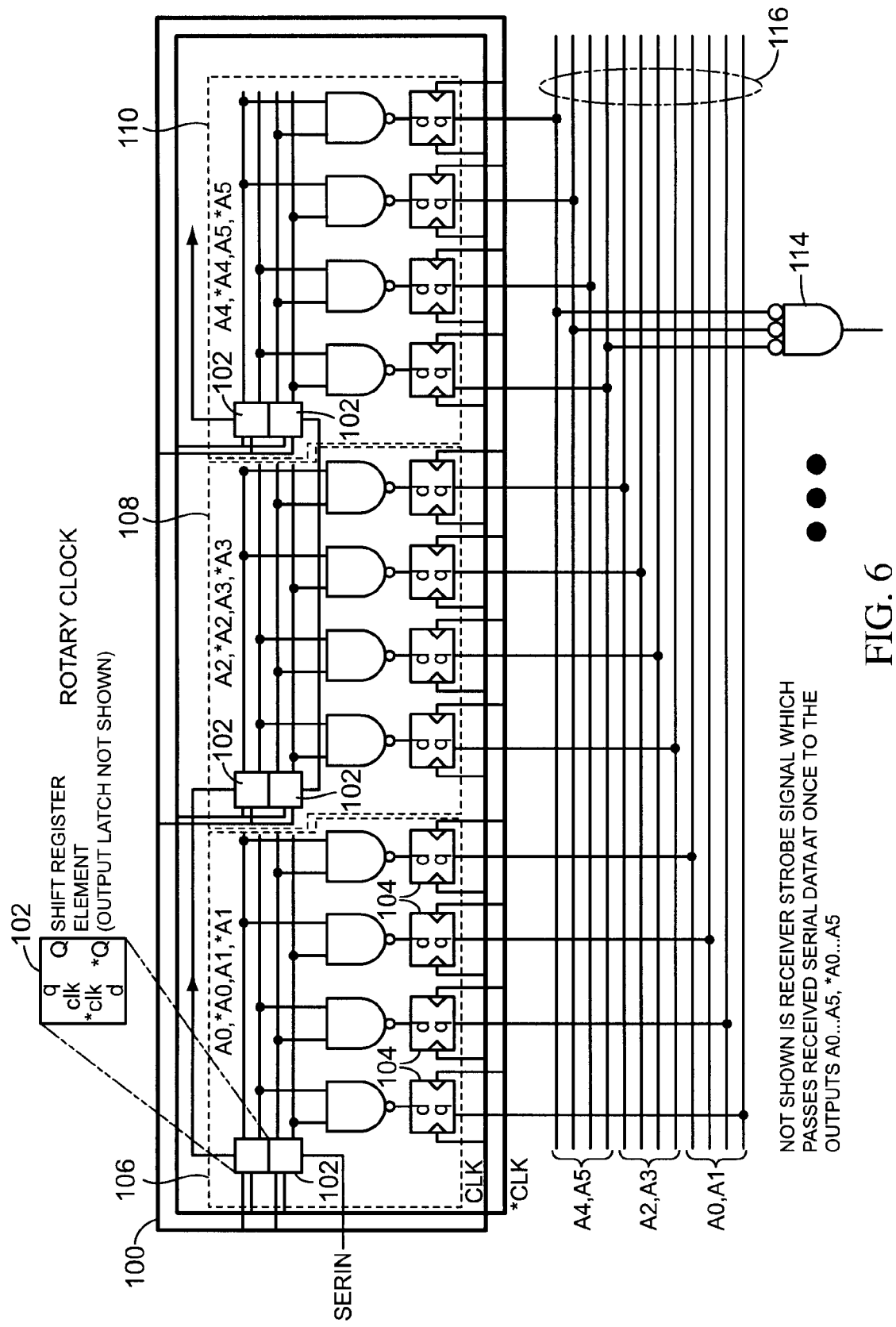
FIG. 6 shows an embodiment of a pipelined decoder in accordance with the present invention.

FIG. 6 shows an embodiment of a pipelined decoder in accordance with the present invention. Included in the embodiment are a rotary traveling wave oscillator 100, as described in U.S. Pat. No. 6,556,089, which is incorporated by reference into the present application, a number of pre-decoder sections 106, 108, 110 that include shift register elements 102, which receive serial address data, combinational logic, and a number of pipeline registers 104 that receive the outputs of the pre-decoding sections, and a number of decoders 114 attached to the outputs of the pipeline registers.

In the example shown in FIG. 6, address lines A0-A5 are decoded. There are three pre-decoding stages 106, 108, 110. The first pre-decoding stage 106 receives address bits A0 and A1 from a first shift register that is clocked by a certain tap of the rotary clock and decodes all possible states of A0 and A1. The second pre-decoding stage 108 receives address bits A2 and A3 from a second shift register that is clocked by a different tap of the rotary clock and decodes all possible states of A2 and A3. The third pre-decoding stage 110 receives address bits A4 and A5 from a third shift register that is clocked yet another different tap of the rotary clock and decodes all possible states of A4 and A5.

The four outputs of the first, second, and third pre-decoding stages are each captured in a set of pipeline registers 104 whose clocks are connected to taps of the rotary clock. The twelve outputs of the pipeline registers form a pre-decode bus 116 to which connections can be made to complete the decoding. Note that as the traveling wave CLK and CLK* move about the rotary clock loop, say in the clockwise direction, the first, second and third shift registers are clocked, and then the pipeline registers of the third, second and first pre-coding stages are clocked. Thus, each pre-decoding stage is pipelined as between the shift register and the pipeline registers and each pre-decoding stage is pipeline with respect to the other pre-decoding stages.

[5] PIPELINE MEMORY DECODERS. EXPLORING HIGH BANDWIDTH PIPELINED CACHE ARCHITECTURE FOR SCALED TECHNOLOGY [p. 778] A. Agarwal, T. Vijaykumar, and K. Roy, *Proceedings, Design, Automation and Test in Europe Conference*, 3-7 Mar. 2003, Messe Munich, Germany. Web: http://www.date-conference.com/conference/2003/

Multiport SRAM, SERDES

SRAMS are often designed to be multi-port, meaning there are two separate address accesses to the same bitstorage nodes. Another technique to achieve the same effect is to multiplex the address and data lines of the SRAM between two or more ports and time-share access to the RAM. This eliminates contention between the ports but requires higher speed for the SRAM.

An interesting possibility where the address decoder is pipelined is to use SERDES ports to multiplex the address and data from multiple remote sources at the 1-bit level and feed the bits alternately from each SERDES address receiver port into the pipeline stages. Having address and data as the single-bit streams allows easy arithmetic on the address and data operands and could be use for memory management purposes.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method for reading a state of a static ram cell having a true bit line and a complement bit line, the method comprising:
    setting a wordline of the static ram cell to a first reference voltage, so that a current flows from the word line to the true bit line or the complement bit line of the cell depending on the state of the cell;
    setting a mode line of a true sense amplifier and a complement sense amplifier connected to the true bit line and the complement bit line, respectively, of the static ram cell to a second reference voltage; and
    detecting the current flowing in either the true bit line or the complement bit line of the cell to read the state of the cell.

2. A method for reading the state of a static ram cell as recited in claim 1, wherein the first reference voltage is a positive voltage.

3. A method for reading the state of a static ram cell as recited in claim 1, wherein the second reference voltage is a ground voltage.

4. A method for reading a state of a static ram cell formed from a first pair and a second pair of transistors, said first pair having gates and drains cross-connected and sources connected, respectively, to a true bit line and a complement bit line to form a cross-coupled pair, said second pair having gates and drains directly connected to form a diode-connected pair, with drains connected to a wordline and sources connected, respectively, to drains of the first pair, said method comprising:
    setting the wordline of the static ram cell to a first reference voltage, so that a current flows from the word line to the true bit line or the complement bit line of the cell depending on the state of the cell;
    setting a mode line of a true sense amplifier and a complement sense amplifier connected to the true bit line and the complement bit line, respectively, of the static ram cell to a second reference voltage; and
    detecting the current flowing in either the true bit line or the complement bit line of the cell to read the state of the cell.

5. A method for reading a state of a static ram cell as recited in claim 4, wherein the step of detecting the current flowing in the true bit line or the complement bit line includes integrating the current flowing in the true bit line or the complement bit line.

* * * * *